(12) United States Patent
Pisu et al.

(10) Patent No.: US 9,267,997 B2
(45) Date of Patent: Feb. 23, 2016

(54) SYSTEMS AND METHODS TO DETERMINE THE CONDITION OF A BATTERY

(71) Applicant: Bayerische Motoren Werke Aktiengesellschaft, Munich (DE)

(72) Inventors: Pierluigi Pisu, Simpsonville, SC (US);
Paul Venhovens, Simpsonville, SC (US);
Sara Mohon, Greenville, SC (US);
James William Streit, Simpsonville, SC (US)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 627 days.

(21) Appl. No.: 13/660,703

(22) Filed: Oct. 25, 2012

(65) Prior Publication Data

US 2014/0115858 A1    May 1, 2014

(51) Int. Cl.
*H01M 10/42* (2006.01)
*G01R 31/36* (2006.01)
*G01R 19/12* (2006.01)

(52) U.S. Cl.
CPC ........... *G01R 31/3624* (2013.01); *H01M 10/42* (2013.01); *G01R 19/12* (2013.01); *Y10T 29/49764* (2015.01); *Y10T 29/49771* (2015.01)

(58) Field of Classification Search
CPC .. G01R 31/36; G01R 31/3606; G01R 31/361; G01R 31/3624; G01R 19/12; G06F 17/16; H01M 10/42

See application file for complete search history.

(56) References Cited

U.S. PATENT DOCUMENTS

| | | | |
|---|---|---|---|
| 7,808,375 B2 | 10/2010 | Bertness et al. |
| 7,902,828 B2 | 3/2011 | Huang |
| 7,924,015 B2 | 4/2011 | Bertness |
| 7,928,735 B2 | 4/2011 | Huang et al. |
| 8,111,037 B2 | 2/2012 | Zhang et al. |
| 2011/0089907 A1 | 4/2011 | Bhardwaj et al. |

OTHER PUBLICATIONS

Yang et al., An Accurate Lithium-Ion Battery Gas Gauge Using Two-Phase STC Modeling, 2007 IEEE, pp. 866-871.*
Windarko et al., SOC Estimation of LiPB Batteries Using Extended Kalman Filter Based on High Accuracy Electrical Model, May 30-Jun. 3, 2011, 8th International Conference on Power Electronics—ECCE Asia, The Shilla Jeju, Korea, pp. 2015-2022.*
Sean Dunford, Calculating the Time Constant of an RC Circuit, 2010, Undergraduate Journal of Mathematical Modeling: One + Two, vol. 2, Issue 2, Article 3, pp. 1-11.*

* cited by examiner

*Primary Examiner* — Toan Le
(74) *Attorney, Agent, or Firm* — Crowell & Moring LLP (57) ABSTRACT

Systems and methods for determining the damage level of a battery are provided. An exemplary method includes measuring a terminal voltage of the battery over time while discharging the battery at a predetermined current; calculating a slope of a natural logarithm of a rate of change of a first voltage of the battery over time based on the terminal voltage of the battery; and comparing the calculated slope to a threshold slope that is based on measurements of a plurality of similar batteries with known conditions. The first voltage of the battery may correspond to a voltage across an RC component of an equivalent circuit model for the battery.

14 Claims, 9 Drawing Sheets

SYSTEMS AND METHODS TO DETERMINE THE CONDITION OF A BATTERY

BACKGROUND OF THE INVENTION

The present invention relates to systems and methods for determining the condition of a battery, such as a damage level of the battery.

There are several related art technologies for evaluating different aspects of the condition of a battery. For example, voltage sensing establishes a predicted voltage discharge curve for the battery with the voltage as a function of the state of charge (SOC), measures the voltage between the terminals of the battery, and compares the measured voltage to the predicted voltage discharge curve to determine the SOC of the battery. However, voltage sensing has the disadvantages that each voltage discharge curve is unique, and that the voltage discharge curve changes as the battery ages.

Another technique is known as coulomb counting, in which the remaining capacity of the battery is determined by measuring the current entering or leaving the battery, and integrating this measurement over time. The current may be measured by using a current shunt, Hall effect transducers, or giant magnetoresistance (GMR) sensors. Coulomb counting uses a fully charged battery as a reference point, and obtains the SOC by comparing the net charge flow with the charge in the fully charged battery. However, coulomb counting has the disadvantages of not directly measuring the energy in the battery, and assuming an initial value of charge in the fully charged battery based on Peukert's law.

An additional method is a cranking test, in which the voltage of the battery is measured during engine cranking and compared to threshold values. The state of health (SOH) of the battery is determined by this comparison. However, the cranking test has the disadvantage of requiring a controlled temperature.

Further, an AC conductance test measures the dynamic conductance of the battery by applying a time-varying small-amplitude AC signal to the battery and measuring the voltage response as a function of time. However, the AC conductance test has the disadvantages that repeated tests are needed at multiple frequencies, and the accuracy is diminished when testing more than one battery.

Electrochemical impedance spectroscopy (EIS) is another method for evaluating the condition of a battery. During the charge-discharge cycles, the composition of the active chemicals in the battery changes as the chemicals are converted between the charged and discharged states. This is reflected by changes to the battery's impedance. EIS estimates the battery's impedance at different AC frequencies. However, EIS has the disadvantages of requiring expensive equipment, as well as training to interpret the results.

Therefore, it would be desirable to provide a method for determining a condition of a battery, such as its damage level, that overcomes the disadvantages discussed above. In addition, it would be advantageous to provide a method that a layperson or a technician with no knowledge of battery chemistry could perform. It would also be advantageous to provide a method in which the battery does not need to be in a rested open-circuit voltage state during testing. Further, it would be advantageous to provide a method of testing a battery during or after the manufacturing process for a new motor vehicle.

SUMMARY OF THE INVENTION

According to an aspect of the invention, a method for assessing a condition of a battery is provided. The method includes measuring a terminal voltage of the battery over time while discharging the battery at a predetermined current; calculating a slope of a natural logarithm of a rate of change of a first voltage of the battery over time based on the terminal voltage of the battery; and comparing the calculated slope to a threshold slope that is based on measurements of a plurality of similar batteries with known conditions. The first voltage of the battery may correspond to a voltage across an RC component of an equivalent circuit model for the battery.

The method may also include calculating the first voltage of the battery over time based on the terminal voltage of the battery. Alternatively, the slope may be calculated based on characteristics of the terminal voltage including a time and a voltage of a first data point recorded after beginning the discharging of the battery, and a time and a voltage of a second data point recorded when a difference in the terminal voltage between successive data points falls below a threshold.

As yet another alternative, the method may include measuring a current of the battery over time while discharging the battery, wherein the slope is calculated based on the terminal voltage and the current of the battery at three or more data points. The slope may be calculated based on a discrete matrix representation.

The calculated slope may correspond to a damage level of the battery. The threshold slope may correspond to a percentage of a state of charge to which the similar batteries have been drained. The percentage of the state of charge may be not greater than 40%.

The threshold slope may be determined by damaging the plurality of similar batteries to a predetermined state of charge; for each of the plurality of similar batteries, recharging the respective battery to an initial state of charge; for each of the plurality of similar batteries, measuring a terminal voltage of the respective battery over time while discharging the respective battery at the predetermined current; for each of the plurality of similar batteries, calculating a slope of a natural logarithm of a rate of change of a second voltage of the respective battery over time based on the terminal voltage of the respective battery; and averaging the calculated slopes of the plurality of similar batteries.

According to another aspect of the invention, an apparatus for determining a damage level of a battery is provided. The apparatus includes a data acquisition board that measures a terminal voltage of the battery over time while the battery is discharged at a predetermined current; and a processor that calculates a slope of a natural logarithm of a rate of change of first voltage of the battery over time based on the terminal voltage of the battery, and compares the calculated slope to a threshold slope that is based on measurements of a plurality of similar batteries with known conditions. The calculated slope may correspond to a damage level of the battery.

The threshold slope may correspond to a percentage of a state of charge to which the similar batteries have been drained. The percentage of the state of charge may be not greater than 40%. In addition, the apparatus may include a DC load that discharges the battery at the predetermined current.

According to another aspect of the invention, a method of manufacturing a vehicle is provided. The method includes manufacturing the vehicle in a plurality of stages and assessing a condition of a battery of the vehicle during at least one of the plurality of stages. The assessing of the condition of the battery includes measuring a terminal voltage of the battery over time while discharging the battery at a predetermined current; and calculating a damage level of the battery as a slope of a natural logarithm of a rate of change of a first voltage of the battery over time based on the terminal voltage of the battery.

The method may also include comparing the calculated damage level to a threshold damage level that is based on measurements of a plurality of similar batteries with known conditions. The threshold damage level may correspond to a percentage of a state of charge to which the similar batteries have been drained. The percentage of the state of charge may be not greater than 40%.

The threshold damage level may be measured by damaging the plurality of similar batteries to a predetermined state of charge; measuring a damage level of each of the plurality of similar batteries; and averaging the measured damage levels of the plurality of similar batteries. The damage level of each of the plurality of similar batteries may be measured by recharging the respective battery to an initial state of charge; measuring a terminal voltage of the respective battery over time while discharging the battery at the predetermined current; and calculating the damage level of the respective battery as a slope of a natural logarithm of a rate of change of a second voltage of the respective battery over time based on the terminal voltage of the respective battery.

Other objects, advantages, and novel features of the present invention will become apparent from the following detailed description of the invention when considered in conjunction with the accompanying drawings.

DETAILED DESCRIPTION OF EXEMPLARY EMBODIMENTS

A battery may be damaged by a variety of mechanisms. For example, lead acid batteries experience sulfation when they are not fully charged. Lead acid batteries include flat lead plates that are immersed in an electrolyte solution of sulfuric acid and water. As the battery discharges, lead and lead dioxide on the plates react with the sulfuric acid in the electrolyte, forming lead sulfate on the plates. If the battery is immediately recharged, this reaction is reversed, and the lead sulfate reverts to lead, lead dioxide, and sulfuric acid.

However, as the battery goes through numerous discharge and charge cycles, some of the lead sulfate slowly converts to a stable crystalline form that no longer dissolves upon recharging. Thus, not all of the lead and lead dioxide is returned to the battery plates, and the amount of usable active material necessary for the generation of electricity declines over time. Further, the lead sulfate deposits on the anodes of the battery prevent the transfer of charge between the anodes and the medium. As more of the plate area is unable to supply current due to sulfation, the battery capacity becomes greatly reduced. Sulfated batteries have a high internal resistance and can deliver only a small fraction of their normal discharge current. Sulfation also affects the charging cycle, resulting in longer charging times, less efficient and incomplete charging, and higher battery temperatures. As the lead sulfate crystals grow, they can mechanically deform or crack the plate. Ultimately sulfation reduces the lifetime of the battery.

Sulfation may also occur when a lead acid battery is drained and stored in a discharged state. The longer the battery remains in the discharged state, the harder it is to overcome the sulfation, which becomes more stable and irreversible. A long period of self-discharge allows very large lead sulfate crystals to form. Sulfation is amplified at elevated temperatures, such as 100° F. or greater.

Batteries may also be damaged by other mechanisms, such as mechanical cracks and/or a reduction of the active surface area due to a deposit of neutral particles. Further, the catalyst may return to a different position after discharging and recharging, causing the battery to become disordered and have a smaller active surface area. In addition, draining the battery to a very low SOC, such as 40% or lower, causes immediate and permanent damage to the battery. Repeatedly draining the battery to a higher SOC, such as 60% or 80%, may cause an equivalent level of damage to the battery.

In order to meet quality standards, such as those required for batteries in motor vehicles, a battery that has been drained to a predetermined SOC must be replaced. For example, before selling a new vehicle to a customer, it may be necessary to replace a battery that has been drained to a 40% SOC, or any other SOC that has been determined by the manufacturer to require replacement. Further, the predetermined SOC at which the battery must be replaced may vary according to the stage of the vehicle manufacturing process at which the battery is tested. For example, the predetermined SOC may vary based on the position of the vehicle in an assembly line.

Exemplary embodiments of the invention provide methods and apparatuses for assessing a condition of a battery, such as a damage level of the battery. For example, exemplary embodiments of the invention may determine whether a battery has been drained to a predetermined SOC. More generally, exemplary embodiments of the invention may determine whether a battery has been damaged by any means that results in damage that is equivalent to draining the battery to the predetermined SOC.

Figure 1:
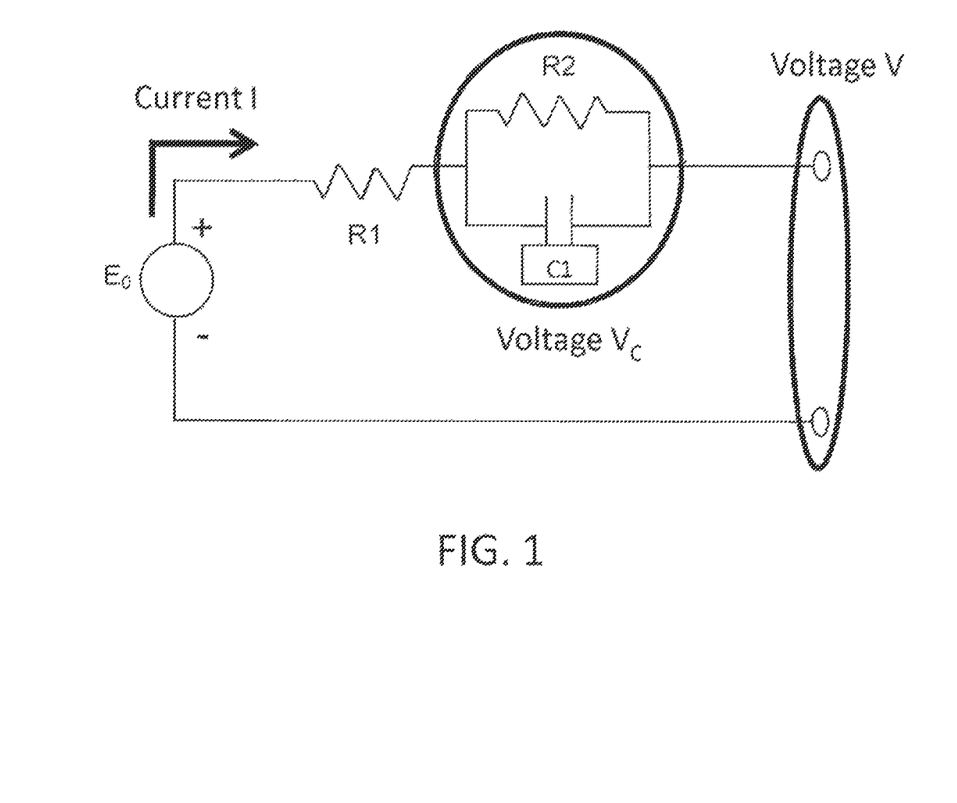
FIG. 1 shows a block diagram of a Randle equivalent circuit model for a battery.

FIG. 1 shows a block diagram of a Randle equivalent circuit model for a battery. As shown in FIG. 1, the circuit includes a resistor R1 and an RC component that includes a resistor R2 and a capacitor C1. When a voltage V is applied across the terminals of the battery, a current I flows through the circuit, and a voltage Vc is established across the RC component.

FIGS. 2(a)-2(f) compare the discharge voltages of healthy and damaged batteries as a function of time. The healthy batteries had never been used, and were initially discharged to a 92% SOC before conducting the test. The damaged batteries were first discharged to a predetermined SOC that would result in damage to the battery, such as a 40% SOC. The damaged batteries were then recharged to a 92% SOC before conducting the test. The 92% SOC of the batteries may be measured based on the voltage discharge curve, which plots the voltage as a function of the SOC. A voltage may be chosen that corresponds to the 92% SOC.

Any appropriate value may be used for the initial SOC. Because the voltage discharge curve shows nonlinear phenomena near a 100% SOC, it may be difficult to determine when the battery has a 100% SOC. Further, the resolution improves when there is a significant difference between the initial SOC and the predetermined SOC. Therefore, it may be advantageous to choose an initial SOC between 90% and 95%; however, any appropriate value may be used.

Figure 2A:
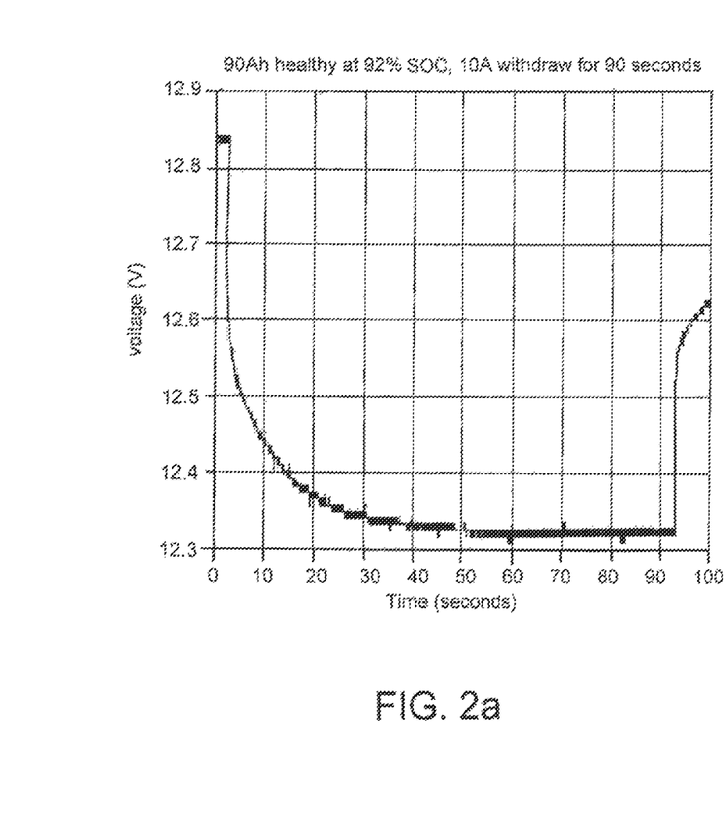
FIGS. 2(a)-2(f) show the discharge voltages of various batteries as functions of time.
Figure 2B:
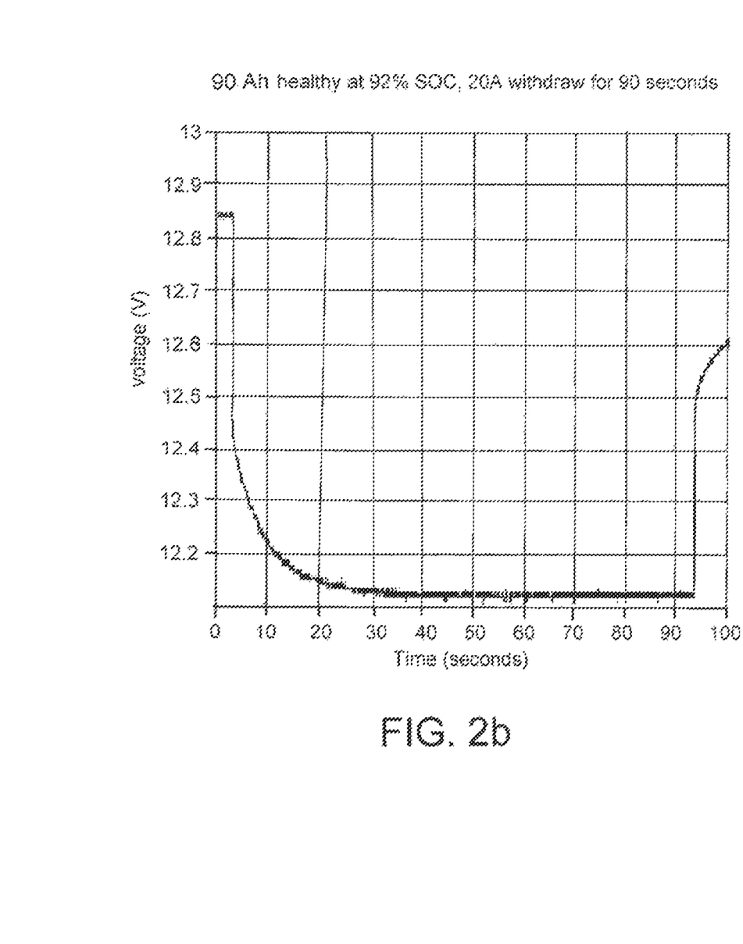
Figure 2C:
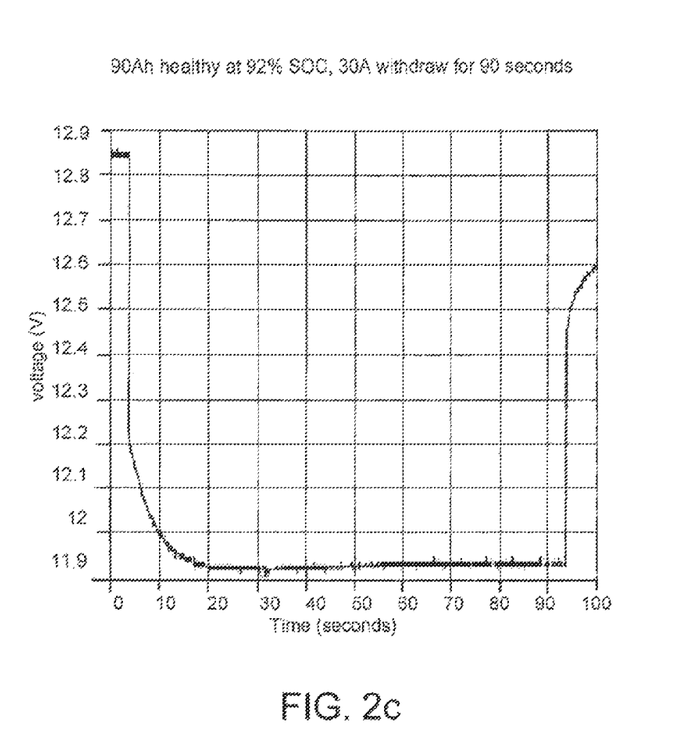
Figure 2D:
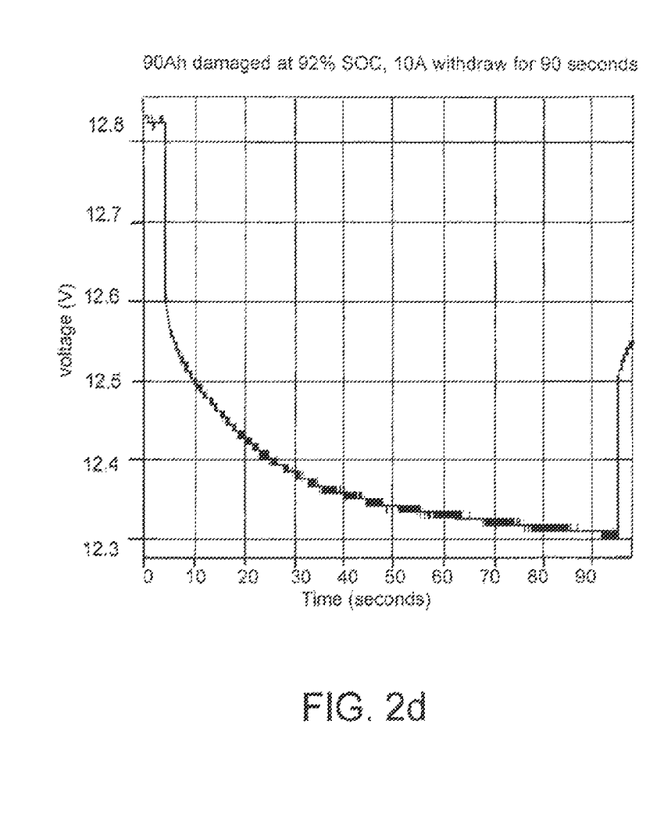
Figure 2E:
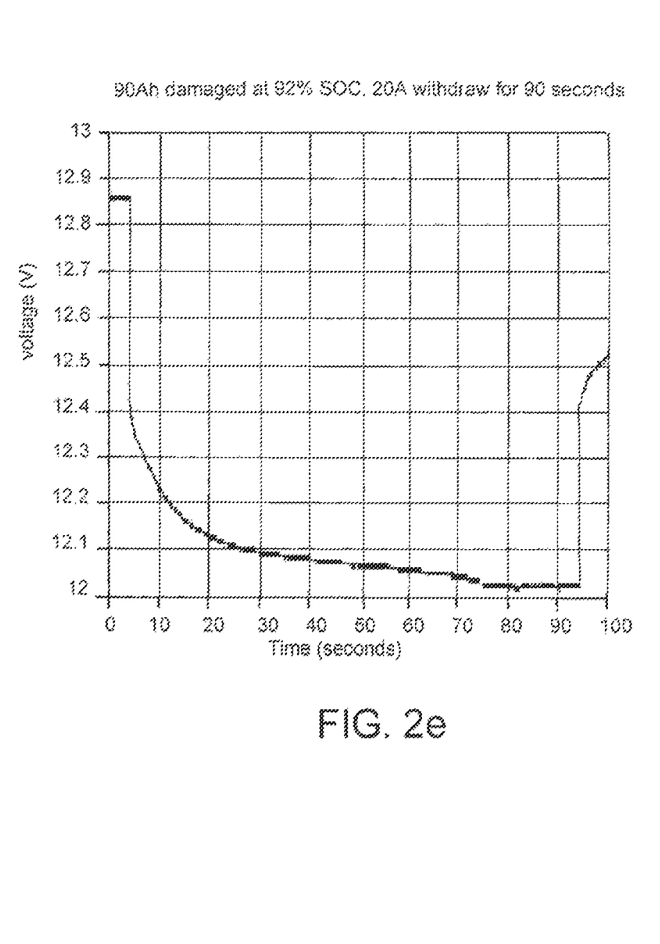
Figure 2F:
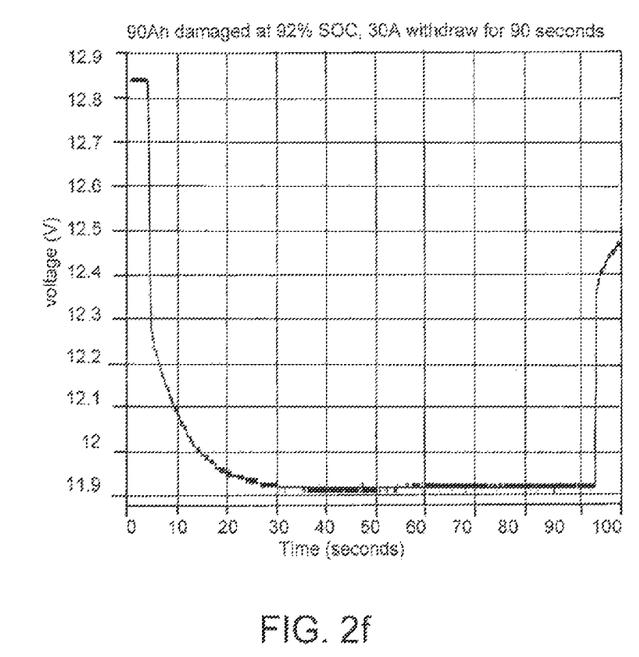

As shown in FIGS. 2(a)-2(f), before discharge all of the batteries have the same initial open circuit voltage. The discharge voltage as a function of time is then obtained by applying a programmable DC load to draw a predetermined current for a length of time. FIGS. 2(a)-2(c) show the discharge voltage for healthy batteries, while FIGS. 2(d)-2(f) show the discharge voltage for damaged batteries. In FIGS. 2(a) and 2(d), a 90 Ah battery was discharged at a 10 A current for 90 seconds. In FIGS. 2(b) and 2(e), a 90 Ah battery was discharged at a 20 A current for 90 seconds. In FIGS. 2(c) and 2(f), a 90 Ah battery was discharged at a 30 A current for 90 seconds.

The RC component shown in FIG. 1 determines the shapes of the curves of the discharge voltages in FIGS. 2(a)-2(f). The discharge voltage may be considered to reach a steady state when it is within a percentage of its minimum value, such as 90% or 99%. As shown in FIGS. 2(a) and 2(d), the discharge voltage reaches a steady state more quickly for a healthy battery than for a damaged battery. This observation may be used to monitor the condition of a battery, as discussed in detail below.

Using the first order Randle equivalent circuit model shown in FIG. 1 and Kirchoffs voltage law, the terminal voltage V of the battery is given by:

$$V = E_0 - R*I - V_C \qquad \text{Equation (1)}$$

where $E_0$ is the open circuit voltage (OCV), R is the resistance of the resistor R1, I is the current, and $V_C$ is the voltage of the RC component, which is given by:

$$V_C = (R_0*I)(1 - e^{-t/R_0*C}) \qquad \text{Equation (2)}$$

where $R_0$ is the resistance of the resistor R2, t is time, and C is the capacitance of the capacitor C1.

The first derivative of the voltage $V_C$ of the RC component with respect to time is given by:

$$\frac{dV_C}{dt} = \frac{I}{C} * (e^{-t/(R_0*C)}) \qquad \text{Equation (3)}$$

Figure 3:
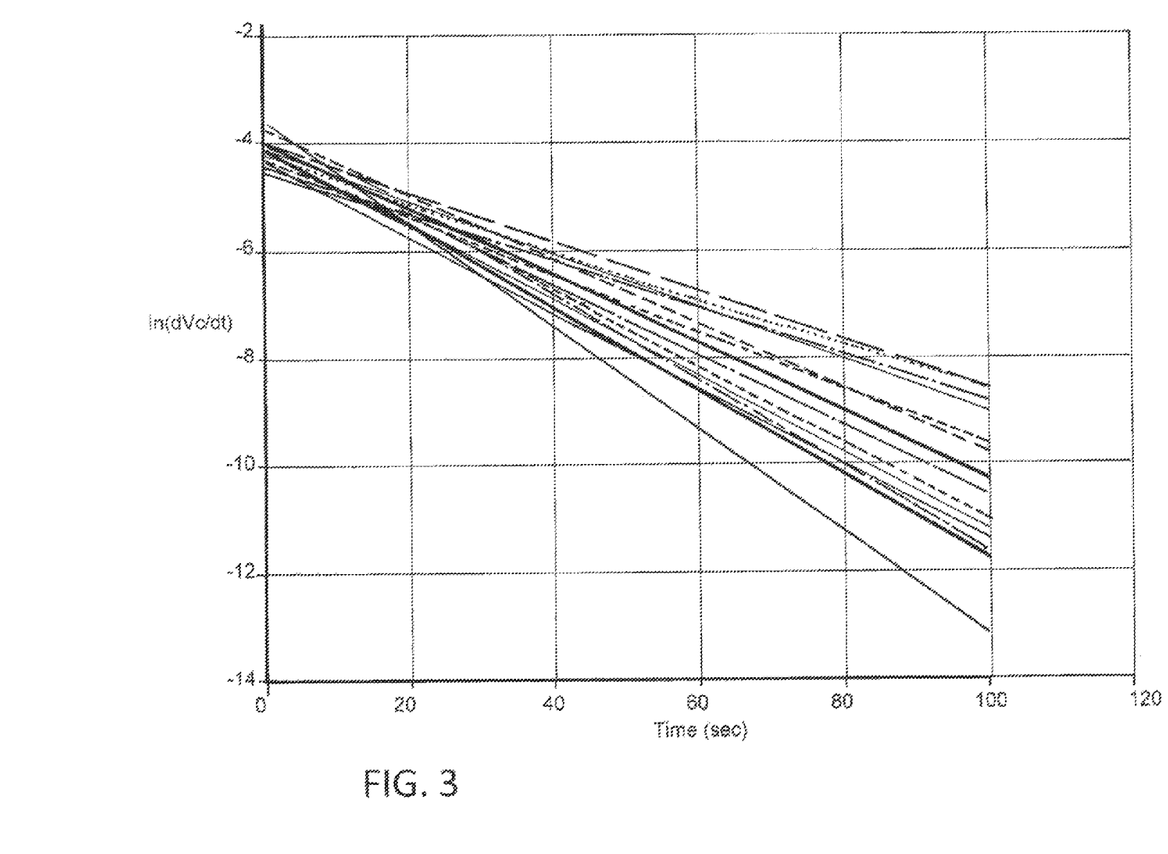
FIG. 3 shows a graph of the natural logarithm of the rate of change of the voltage $V_C$ of a plurality of batteries with respect to time.

Because Equation (3) is an exponential function, a plot of the natural logarithm of the function versus time will yield a straight line, as shown in FIG. 3. Exemplary embodiments of the invention use the slope of this line as an indicator of the level of damage to the battery. The slope may be calculated by fitting a straight line to the plot, or by simply measuring the slope between two points on the line.

In comparing the pairs of graphs for healthy and damaged batteries, it is apparent that the differences in the discharge voltage curves are more pronounced between FIGS. 2(a) and 2(d) than between FIGS. 2(c) and 2(f), for example. Therefore, it may be advantageous to use a smaller predetermined current, such as 10 A, to determine the condition of a battery.

Figure 4:
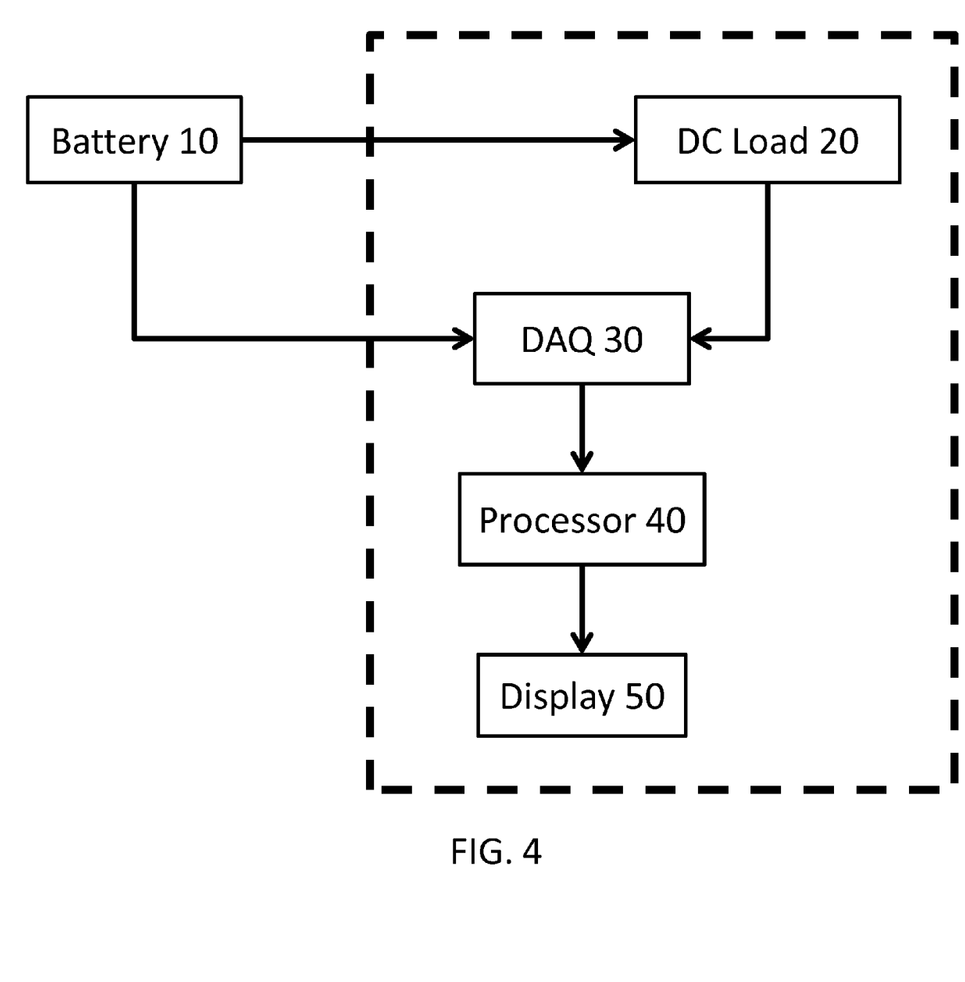
FIG. 4 shows a block diagram of an apparatus for determining the condition of a battery according to exemplary embodiments of the invention.

FIG. 4 shows a block diagram of an apparatus for determining the condition of a battery according to exemplary embodiments of the invention. As shown in FIG. 4, a DC load 20 draws a substantially constant predetermined current from the battery 10. A data acquisition (DAQ) board 30 measures the current I from the DC load 20 and the terminal voltage V from the battery 10 while the battery 10 discharges. The DAQ board 30 transmits the data to the processor 40.

Figure 5:
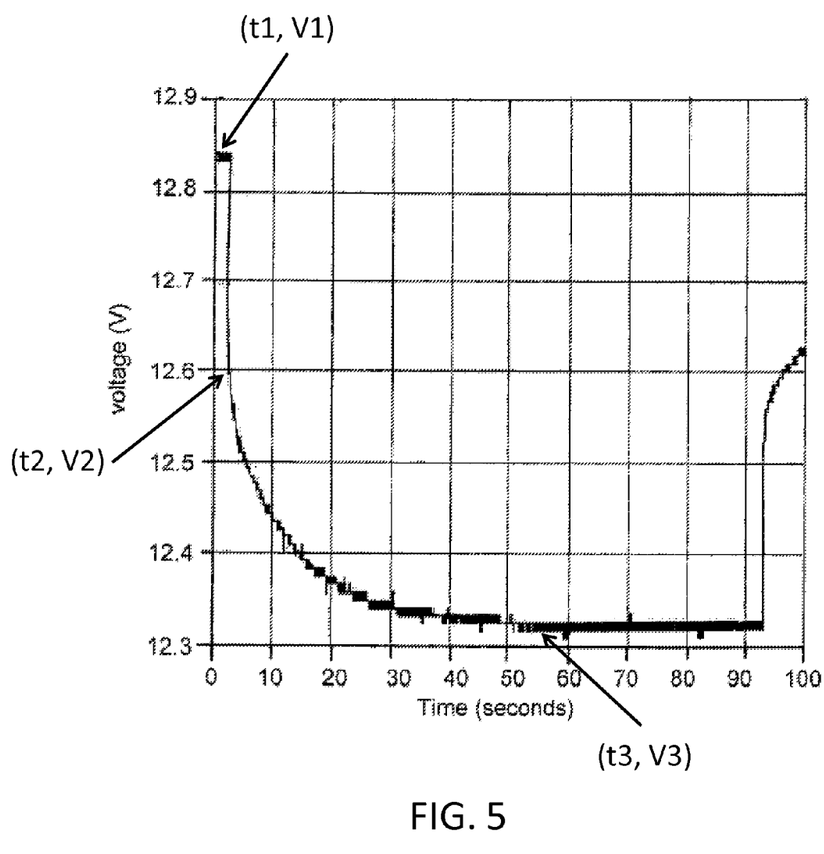
FIG. 5 shows examples of how to calculate the slope of the natural logarithm of the rate of change of the voltage $V_C$ according to various embodiments of the invention.

FIG. 5 shows how to calculate the slope of the natural logarithm of the rate of change of the voltage $V_C$ according to various embodiments of the present invention. The measured terminal voltage V is annotated and shown as a function of time in FIG. 5. In a first embodiment, the processor 40 calculates the voltage $V_C$ as a function of time based on Equation (1). The open circuit voltage $E_0$ is measured before the DC load 20 starts drawing current from the battery 10, the current I is measured while the battery 10 discharges, and the resistance R is calculated according to:

$$R = \frac{E_0 - V2}{I} \qquad \text{Equation (4)}$$

where V2 is a voltage measured immediately after the DC load 20 starts drawing current from the battery 10 but before the terminal voltage V begins to curve. As shown in FIG. 5, V2 may be the voltage measured at the first data point after the DC load 20 starts drawing current from the battery 10. For example, V2 would be approximately 12.6 V based on the terminal voltage curve shown in FIG. 5.

In the first embodiment, the processor 40 then calculates the first derivative of the voltage $V_C$ of the battery 10 with respect to time. Next the processor 40 calculates the natural logarithm of the first derivative of the voltage $V_C$ with respect to time, and calculates the slope of the natural logarithm as the damage level of the battery 10. Next the processor 40 compares the slope to a threshold damage level and transmits the result to the display 50, which displays the result.

The slope may be calculated by any appropriate method. For example, in a second embodiment, the processor 40 calculates the slope based on characteristics of the measured terminal voltage V. According to the right-hand side of Equation (3), the slope of the natural logarithm of $dV_C/dt$ may be expressed as $-1/R_0C$. $R_0$ may be calculated according to:

$$R_0 = \frac{V2 - V3}{I} \qquad \text{Equation (5)}$$

where V3 is a voltage measured after the discharge from the capacitor C1 has stabilized. V3 may be estimated visually or by using the processor 40 to apply thresholds that account for noise in the measurements. For example, the processor 40 may select V3 when the voltage difference between successive data points is less than 0.01 V. In the example shown in FIG. 5, V3 is approximately 12.325 V. C may then be calculated according to:

$$C = \frac{t3 - t2}{4R_0} \qquad \text{Equation (6)}$$

where t3 and t2 are the times at which the voltages V3 and V2 were measured, respectively, as shown in FIG. 5. The slope is then calculated as $-1/R_0C$.

According to a third embodiment, the slope may be calculated by using a discrete matrix representation of the system. In this approach, R, $R_0$, and C are unknown parameters that are determined based on the measured terminal voltage V shown in FIG. 5 and a generalized inverse matrix. Equation (1) may be discretized and rewritten as:

$$V_C(k) = E_0 - R*I(k) - V(k) \qquad \text{Equation (7)}$$

where k is an index of the dataset. Further, Equation (3) may be discretized and rewritten as:

$$R_0 C \left[ \frac{V_C(k+1) - V_C(k)}{T} \right] + V_C(k) = I(k) R_0 \quad \text{Equation (8)}$$

where T is the sampling rate. In this embodiment, both the terminal voltage V and the current I are measured as functions of time. The system may be represented by the following matrices:

$$[-I(k+1) + I(k) \quad -V(k+1) + V(k) \quad -I(k)] \begin{bmatrix} R_0 RC \\ R_0 C \\ T(R_0 + R) \end{bmatrix} = -T[E_0 - V(k)] \quad \text{Equation (9)}$$

This yields three equations having three unknowns, namely R, $R_0$, and C. Equation (9) may then be used to solve for R, $R_0$, and C, and the slope is again calculated according to $-1/R_0 C$. At least three data points are required to determine R, $R_0$, and C; however, any appropriate number of data points may be used. For example, it may be advantageous to use several hundred data points to minimize the effects of noise in the measurements.

Figure 6:
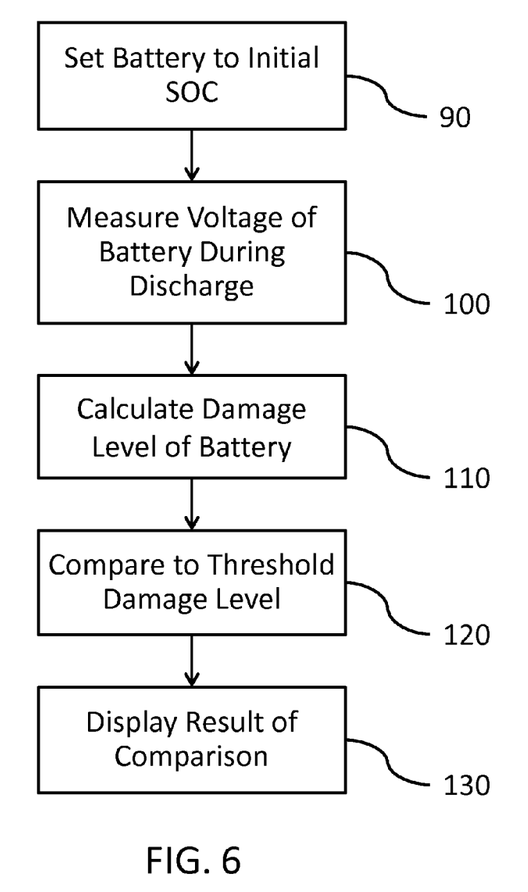
FIG. 6 shows a method for determining the condition of a battery according to exemplary embodiments of the invention.

FIG. 6 shows a corresponding method for determining the condition of a battery according to exemplary embodiments of the invention. As shown in FIG. 6, the battery is first set to an initial SOC in step 90. This initial SOC may be substantially the same as the initial SOC used to measure a threshold damage level based on reference batteries, as discussed below. The terminal voltage V of the battery 10 is then measured over time while the battery 10 is discharged at a substantially constant predetermined current in step 100. Next the damage level of the battery 10 is calculated by one of the methods described above at step 110, and compared to the threshold damage level at step 120. The result of the comparison is displayed at step 130.

Figure 7:
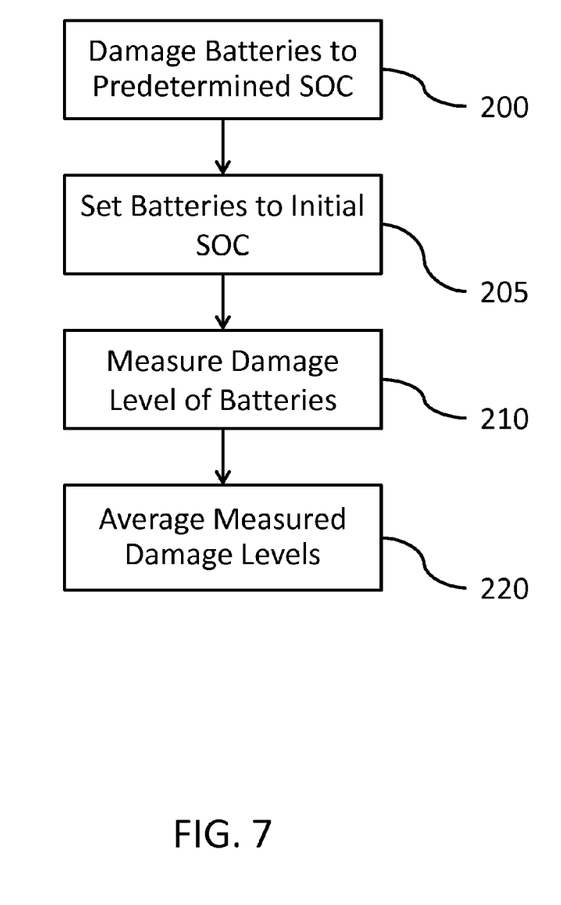
FIG. 7 shows a method for calculating the threshold damage level according to exemplary embodiments of the invention.

According to exemplary embodiments of the invention, the threshold damage level may be calculated according to the method shown in FIG. 7. At step 200, a plurality of batteries that are similar to the battery 10 are damaged by draining the batteries to a predetermined SOC. Alternatively, the batteries may be damaged to an equivalent damage level by any appropriate method, such as repeatedly damaging the batteries to a higher SOC, applying heat to the batteries, etc. The batteries may be damaged in a manner that is similar to the usage pattern of the batteries in an assembly line of a motor vehicle. The plurality of batteries may have the same manufacturer and model number as the battery 10.

The batteries are then recharged to the initial SOC at step 205, and the damage level of each battery is measured at step 210. The terminal voltage V of each battery is measured as a function of time while discharging the battery at the substantially constant predetermined current I. The damage level of each battery is then calculated as the slope of the natural logarithm of the rate of change of the voltage $V_C$ of the battery over time by any appropriate method, such as the methods described above for calculating the slope. The damage levels of the batteries are then averaged at step 200, resulting in the threshold damage level. Any suitable number of batteries may be averaged. For example, 1000 batteries may be averaged to obtain the most accurate results. However, averaging is not required, and the damage level of a single reference battery may be used as the threshold damage level.

FIG. 3 shows a series of graphs of the natural logarithm of the rate of change of the voltage $V_C$ (i.e., $$\ln\left(\frac{dV_C}{dt}\right))$$

for different batteries. In these examples, a discharge current of 10 A was applied for 90 seconds. As discussed above, the slope of this graph may correspond to the damage level of the battery. The line with the largest magnitude of the slope (0.0715) in FIG. 3 corresponds to a battery that was damaged to a 40% SOC, which may be the level at which the battery may be deemed to require replacement, depending on the application. As discussed above, similar batteries may also be damaged to a 40% SOC, and their damage levels may be averaged to establish the threshold damage level.

The damage level of a battery under test is measured under the same conditions as those used to measure the threshold damage level, and compared with the threshold damage level. The results may be communicated to the user via the display 50. For example, a color code could be used to indicate the status of the battery, such that red indicates a need to replace the battery immediately, yellow indicates that the battery will need to be replaced in the near future, and green indicates that the battery is in good condition. Each status may correspond to a magnitude or a percent by which the damage level of the battery under test differs from the threshold damage level. For example, the display 50 may show red if the damage level of the battery under test is greater than the threshold damage level; yellow if the damage level of the battery under test is 90%-100% of the threshold damage level; and green if the damage level of the battery under test is less than 90% of the threshold damage level.

The apparatus within the dashed line in FIG. 4 may be integrated into a product, such that the user can determine the condition of the battery at any time. For example, the apparatus may be integrated into a motor vehicle or an electronic device to indicate the health of the battery. Alternatively, the apparatus may be a stand-alone device, and may be portable to allow the measurement of different batteries throughout a facility.

As another example, the apparatus may be used to measure the condition of a battery during the manufacture of a motor vehicle. The condition of the battery may be affected by storage and/or discharge during the manufacturing process. For example, there may be a delay between stages of the manufacturing process, and the battery may be used to supply power to various components of the vehicle during the manufacturing process. Accordingly, the apparatus may verify that the battery is in good condition at various stages during the manufacturing process. This may advantageously ensure that a newly manufactured vehicle is delivered to a customer with a battery that has not been damaged to an unacceptable level.

According to another exemplary embodiment of the invention, there is provided a non-transitory computer-readable medium encoded with a computer program for determining a condition of a battery. The term "computer-readable medium" as used herein refers to any medium that participates in providing instructions for execution. Common forms of computer-readable media include, for example, a floppy disk, a flexible disk, a hard disk, magnetic tape, any other magnetic medium, a CD-ROM, any other optical medium, a RAM, a PROM, an EPROM, a FLASH-EPROM, any other memory chip or cartridge, a flash drive, and any other non-transitory medium from which a computer can read.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for assessing a condition of a battery, the method comprising:
   measuring, by a data acquisition board, a terminal voltage of the battery over time while discharging the battery at a predetermined current;
   calculating, by a processor, a first slope of a natural logarithm of a rate of change of a first voltage of the battery over time based on the terminal voltage of the battery;
   comparing, by the processor, the calculated first slope to a threshold slope that is based on measurement of at least one of a plurality of similar batteries with known condition; and
   displaying, by the processor, a result of said comparing on a display, wherein said result corresponds to a damage level of the battery,
   wherein the threshold slope is determined by:
   damaging at least one of the plurality of similar batteries,
   for each of the at least one of the plurality of similar batteries, recharging the respective battery to an initial state of charge,
   for each of the at least one of the plurality of similar batteries, measuring a terminal voltage of the respective battery over time while discharging the respective battery at the predetermined current,
   for each of the at least one of the plurality of similar batteries, calculating second slope of a natural logarithm of a rate of change of a second voltage of the respective battery over time based on the terminal voltage of the respective battery, and
   deriving the threshold slope from each of the calculated second slopes.

2. The method according to claim 1, wherein the first voltage of the battery corresponds to a voltage across an RC component of an equivalent circuit model for the battery.

3. The method according to claim 1, further comprising calculating the first voltage of the battery over time based on the terminal voltage of the battery.

4. The method according to claim 1, wherein the first slope is calculated based on characteristics of the terminal voltage comprising:
   a time and a voltage of a first data point recorded after beginning the discharging of the battery, and
   a time and a voltage of a second data point recorded when a difference in the terminal voltage between successive data points falls below a threshold.

5. The method according to claim 1, further comprising:
   measuring a current of the battery over time while discharging the battery;
   wherein the first slope is calculated based on the terminal voltage and the current of the battery at three or more data points.

6. The method according to claim 5, wherein the first slope is calculated based on a discrete matrix representation.

7. The method according to claim 5, wherein the threshold slope is derived from the calculated second slopes by average the calculated second slopes.

8. The method according to claim 1, wherein the threshold slope corresponds to a percentage of a state of charge to which the similar batteries have been drained.

9. The method according to claim 8, wherein the percentage of the state of charge is not greater than 40%.

10. An apparatus for assessing a condition of a battery, the apparatus comprising:
    a display;
    a data acquisition board that measures a terminal voltage of the battery over time while the battery is discharged at a predetermined current; and
    a processor that:
      calculates a first slope of a natural logarithm of a rate of change of a first voltage of the battery over time based on the terminal voltage of the battery,
      compares the calculated first slope to a threshold slope that is based on measurements of at least one of a plurality of similar batteries with known conditions; and
      displays a result of said comparison on the display, wherein
    said result corresponds to a damage level of the battery,
    wherein the threshold slope is determined by:
    damaging at least one of the plurality of similar batteries,
    for each of the at least one of the plurality of similar batteries, recharging the respective battery to an initial state of charge,
    for each of the at least one of the plurality of similar batteries, measuring a terminal voltage of the respective battery over time while discharging the respective battery at the predetermined current,
    for each of the at least one of the plurality of similar batteries, calculating a second slope of a natural logarithm of a rate of change of a second voltage of the respective battery over time based on the terminal voltage of the respective battery, and
    deriving the threshold slope from the calculated second slopes.

11. The apparatus according to claim 10, wherein the threshold slope corresponds to a percentage of a state of charge to which the similar batteries have been drained.

12. The apparatus according to claim 11, wherein the percentage of the state of charge is not greater than 40%.

13. The apparatus according to claim 10, further comprising a DC load that discharges the battery at the predetermined current.

14. The apparatus according to claim 10, wherein the threshold slope is derived from the calculated second slopes by average the calculated second slopes.

* * * * *